(12) United States Patent
Timans

(10) Patent No.: US 11,195,732 B2
(45) Date of Patent: Dec. 7, 2021

(54) LOW THERMAL BUDGET ANNEALING

(71) Applicants: Mattson Technology, Inc., Fremont, CA (US); Beijing E-Town Semiconductor Technology Co., Ltd., Beijing (CN)

(72) Inventor: Paul J. Timans, Cambridge (GB)

(*) Notice: Subject to any disclaimer, the term of this patent is extended or adjusted under 35 U.S.C. 154(b) by 419 days.

(21) Appl. No.: 16/376,031

(22) Filed: Apr. 5, 2019

(65) Prior Publication Data

US 2019/0318947 A1 Oct. 17, 2019

Related U.S. Application Data

(60) Provisional application No. 62/656,428, filed on Apr. 12, 2018.

(51) Int. Cl.
*H01L 21/324* (2006.01)
*H01L 21/67* (2006.01)
*F27B 17/00* (2006.01)
*H01L 21/268* (2006.01)

(52) U.S. Cl.
CPC .... *H01L 21/67115* (2013.01); *F27B 17/0025* (2013.01); *H01L 21/268* (2013.01); *H01L 21/324* (2013.01); *H01L 21/67248* (2013.01)

(58) Field of Classification Search
None
See application file for complete search history.

(56) References Cited

U.S. PATENT DOCUMENTS

| 6,511,892 | B1 | 1/2003 | Ping et al. |
| 6,849,831 | B2 | 2/2005 | Timans et al. |
| 6,963,692 | B2 | 11/2005 | Camm et al. |
| 7,145,104 | B2* | 12/2006 | Talwar ............ H01L 21/324 219/390 |
| 7,745,762 | B2 | 6/2010 | Timans |
| 7,800,081 | B2* | 9/2010 | Moffatt ............ H01L 21/2686 250/492.2 |
| 8,383,513 | B2 | 2/2013 | Tsai et al. |
| 8,557,721 | B2 | 10/2013 | Timans |
| 9,449,825 | B2* | 9/2016 | Yokouchi ............ F27B 5/14 |
| 9,498,845 | B2* | 11/2016 | Moffatt ............ B23K 26/0853 |

(Continued)

OTHER PUBLICATIONS

International Preliminary Report on Patentability for Application No. PCT/US2019/026020, dated Oct. 22, 2020. 10 pages.

(Continued)

*Primary Examiner* — Joseph M. Pelham

(57) ABSTRACT

Methods and systems for providing a short-duration anneal are provided. In one example, the methods and systems can include placing a workpiece in a thermal processing chamber. The workpiece can include a device side surface and an opposing non-device side surface. The methods and systems can include delivering an energy pulse from at least one heat source to the non-device side surface of the workpiece. In another example, the methods and systems can include depositing a layer of semiconductor material onto the semiconductor workpiece at the device side of the semiconductor workpiece. The methods and systems can include doping the layer of semiconductor material with a doping species and annealing the layer for crystallization using solid phase epitaxy.

20 Claims, 10 Drawing Sheets

(56) References Cited

U.S. PATENT DOCUMENTS

| | | | |
|---|---|---|---|
| 10,181,409 B2* | 1/2019 | Moffatt | B23K 26/0006 |
| 2002/0067918 A1* | 6/2002 | Camm | H01L 21/268 |
| | | | 392/416 |
| 2002/0111043 A1 | 8/2002 | Mahawili | |
| 2003/0183612 A1* | 10/2003 | Timans | C30B 31/12 |
| | | | 219/390 |
| 2006/0096677 A1* | 5/2006 | Camm | G01J 5/0003 |
| | | | 148/565 |
| 2008/0190909 A1* | 8/2008 | Yokouchi | H01L 21/68792 |
| | | | 219/385 |
| 2008/0273867 A1* | 11/2008 | Camm | H01L 21/268 |
| | | | 392/416 |
| 2010/0252547 A1 | 10/2010 | Timans | |
| 2011/0274417 A1 | 11/2011 | Camm et al. | |
| 2012/0208377 A1 | 8/2012 | Timans | |
| 2012/0244725 A1* | 9/2012 | Fuse | H01L 21/2686 |
| | | | 438/799 |
| 2013/0203269 A1* | 8/2013 | Yokouchi | H01L 21/6838 |
| | | | 438/795 |
| 2014/0329340 A1* | 11/2014 | Yokouchi | H01L 21/324 |
| | | | 438/10 |

OTHER PUBLICATIONS

Martinez-Limia et al., "Solid state annealing of ion implanted silicon by incoherent light pulses and multiscan electron beam," *Materials Science Forum*, 2008, ISSN: 1662-9752, vols. 573-574, pp. 279-293.

Stuart et al., "Temperature Diagnostics For A Dual-Arc FRTP Tool," *10th IEEE International Conference on Advanced Thermal Processing of Semiconductors*, Sep. 25-27, 2002, Vancouver, BC, Canada, pp. 77-85.

PCT International Search Report and Written Opinion for corresponding PCT Application No. PCT/US2019/026020, dated Jul. 29, 2019, 13 pages.

* cited by examiner

LOW THERMAL BUDGET ANNEALING

PRIORITY CLAIM

The present application claims the benefit of priority of U.S. Provisional Application Ser. No. 62/656,428, titled "Low Thermal Budget Annealing," filed on Apr. 12, 2018, the entirety of which is incorporated by reference for all purposes.

FIELD

The present disclosure relates generally to thermal processing of workpieces, such as semiconductor wafers.

BACKGROUND

Thermal treatment systems can be used for processing of workpieces, such as silicon wafers. Example thermal processes can be used for anneal, growth or deposition of a film, crystallization, phase change, or other applications. For instance, anneal processes can repair ion implant damage, improve the quality of deposited layers, improve the quality of layer interfaces, to activate dopants, and to achieve other purposes, while at the same time controlling the diffusion of dopant species for a workpiece.

Millisecond, or ultra-fast, temperature treatment of semiconductor workpiece can be achieved using an intense and brief exposure of or "flash" of light to heat the device side surface of the workpiece. As used herein, the device side surface of the workpiece refers to the workpiece surface includes device structures, films, layers or other elements to be thermally processed. Millisecond anneal system can heat a device side surface of the workpiece at rates that can exceed $10^{4\circ}$ C. per second.

SUMMARY

Aspects and advantages of embodiments of the present disclosure will be set forth in part in the following description, or may be learned from the description, or may be learned through practice of the embodiments.

One example aspect of the present disclosure is directed to a method for thermal processing of a workpiece. The method includes placing the workpiece in a thermal processing chamber, the workpiece having a device side surface and an opposing non-device side surface, the workpiece having a thickness between the device side surface and the opposing non-device side surface. The method includes delivering an energy pulse from at least one heat source to the non-device side surface of the workpiece, the energy pulse having a pulse duration. The pulse duration is less than a thermal conduction time for heat from the energy pulse to diffuse through the thickness of the workpiece and is such that a rate of heating the device side surface is greater than 1000 K/s. A rate of cooling the device side surface is less than about 1000 K/s.

Other example aspects of the present disclosure are directed to systems, methods, devices, and processes for thermally treating a semiconductor substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
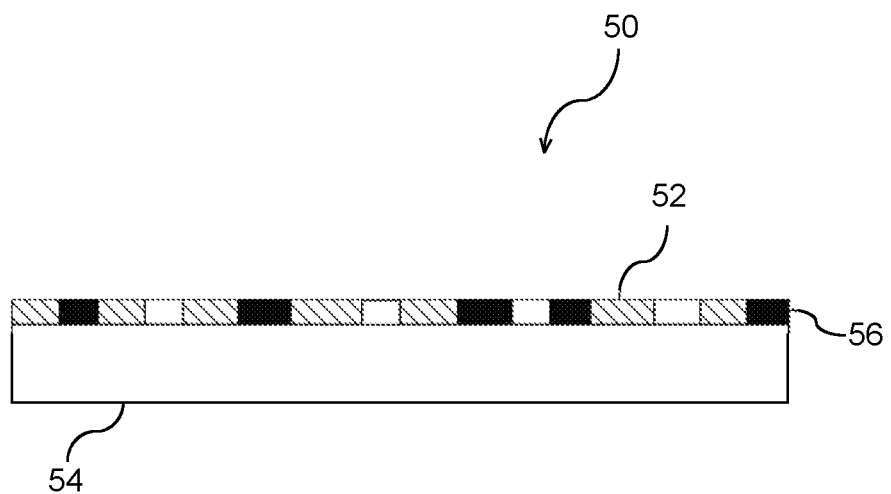
FIG. 1 depicts an example workpiece that can be used in a thermal processing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods and systems for providing a short-duration anneal to process workpieces, such as semiconductor workpieces, opto-electronic workpieces, flat panel displays, or other suitable workpieces. The workpiece materials can include, for instance, silicon, silicon germanium, glass, plastic, or other suitable material. In some embodiments, the workpieces can be semiconductor wafers. The methods can be used in various thermal processing systems that can implement a variety of workpiece manufacturing processes, including, but not limited to anneal processes (e.g., soak anneal, spike anneal, and/or millisecond anneal, etc.), vacuum anneal processes, rapid thermal processes, processes of growth of films, processes of deposition of films, processes of crystallization, processes of phase changes, etc.

In example millisecond anneal applications, an energy pulse can be delivered to a workpiece when the workpiece is at a relatively low temperature (e.g., at room temperature) or when the workpiece has been preheated to an intermediate temperature, $T_i$. For processing silicon workpieces, $T_i$ can be between room temperature and about 900 degrees Celsius (° C.). Preheating to the intermediate temperature can be accomplished by a hot wall environment, a hot plate or susceptor, a hot gas stream, or by radiant heat sources, such as halogen lamps, arc lamps, lasers, heat sources producing particle beams, heat sources producing RF, or heat sources producing microwave. The preheating can be delivered to either side surface or both side surfaces of the workpiece. The preheating can also be delivered by the same heat source that can deliver the energy pulse. However, the preheating can take place over a relatively longer time scale and can produce a relatively lower heating rate, such as less than about 500 Kelvin per second (K/s), such as less than about 250 K/s. Heating with the energy pulse can be performed in time relation to a preheating cycle. For example, heating with the energy pulse can happen within 1 second of the end of a preheating ramp up stage that can heat the workpiece to the intermediate temperature $T_i$.

In some example millisecond anneal heating profiles, a workpiece can be initially heated by a preheating heat source so that the workpiece's temperature can rise until the workpiece's temperature reaches an intermediate temperature $T_i$, such as 750° C., etc. After the workpiece's temperature reaching at $T_i$, an energy pulse can be delivered to a first side surface of the workpiece to produce a very rapid temperature rise in the workpiece. In some cases, energy produced by the energy pulse can be absorbed relatively close to the first side surface of the workpiece such that the temperature rise at the first side surface can initially be very fast, and a large temperature gradient can be created through thickness of the workpiece. After the initial and very rapid temperature rise at the first side surface of the workpiece, heat can diffuse through the thickness of the workpiece, causing a more gradual temperature rise at an opposite second side surface of the workpiece. The temperature at the first side surface can decrease after reaching a peak. As heat diffuses through the thickness of the workpiece, the temperatures of both sides of the workpiece can become similar, until the initial temperature gradient has dissipated. For a typical semiconductor wafer thickness, heating with energy pulse applied to the first side surface of the workpiece can lead to a rapid increase in the temperature of the opposite second side surface of the workpiece, over a period of less than about 50 milliseconds (ms). After this rapid temperature rise, the temperature of both sides become similar and then can decrease, as heat can be lost from both sides of the workpiece by a combination of radiation, conduction, and/or convection. This cooling process can be slower than the very fast temperature rise produced by the energy pulse from the heat source, leading to an "asymmetrical spike" heating profile at the opposite second surface.

This example millisecond anneal temperature profile can create a very large temperature rise at the first side surface where the energy pulse is delivered. If the energy pulse is delivered to the first side surface of the workpiece over a time scale that is short relative to the time for heat to diffuse through the thickness of the workpiece, then the first side surface of the workpiece can become substantially hotter than the opposite second side surface. Effective pulsed surface heating of the first side surface can be achieved by selective absorption of the pulsed energy within an absorption depth that is significantly less than the wafer thickness.

Spike anneal processes can be used to create a very short peak width (e.g., 50 Kelvin peak width) of a heating profile (also referred as temperature-time profile) for low temperatures. For example, spike anneals can be used for high-k dielectric anneals, dopant activation and contact formation. However, it can be difficult to deliver a very short peak width spike anneal (e.g., less than about 1 second peak width) for relatively low peak temperatures, and/or without severe pattern effects and/or non-uniformity. According to example aspects of the present disclosure, the methods and systems for providing a short-duration anneal to process workpieces can be used to enhance spike anneal uniformity with relatively high spatial resolution.

According to example embodiments of the present disclosure, a workpiece can be placed in a thermal processing chamber. The workpiece can include a device side surface that can include one or more device structures, films, or layers that are annealed during the energy pulse and an opposing non-device side surface that can include no device structures.

FIG. 1 depicts an example workpiece 50 to be processed according to example embodiments of the present disclosure. The workpiece 50 includes a device side surface 52 and a non-device side surface 54. The device side surface 52 includes one or more device structures, films, or layers. The non-device side surface 54 includes no device structures. The workpiece can include a thickness (e.g., about 775 μm, or other suitable thickness) between the device side surface 52 and the non-device side surface 54.

A method for thermal processing the workpiece can include delivering an energy pulse (e.g., an irradiance flash, etc.) from at least one heat source (e.g., an arc lamp, a laser, or other suitable heat source) to the non-device side surface of the workpiece. The energy pulse can have a pulse duration (e.g., in a range of about 0.1 ms to about 100 ms, such as in a range of about 2 ms to about 100 ms, such as in a range of about 5 ms to about 30 ms). The pulse duration can be less than a thermal conduction time for heat from the energy pulse to diffuse through the thickness of the workpiece and can be such that a rate of heating the device side surface can be greater than 1000 K/s, and a rate of cooling the device side surface can be less than about 1000 K/s.

The arrangement of the device side surface and the opposing non-device side surface of the workpiece in a thermal processing apparatus is not limited to any particular spatial orientation of the workpiece. The workpiece can be supported in any spatial orientation during thermal processing. In some embodiments, the device side surface can face upwards, with a workpiece support structure supporting the workpiece either from below and/or from above. For instance, a workpiece support structure located above the workpiece (e.g., a Bernoulli chuck) can be used without contacting device structures of the device side surface. Such configurations can prevent irradiation of the non-device side surface from being affected by optical and/or thermal impacts from the workpiece support structure, thereby reducing non-uniformity process caused by the above impacts. Such configurations can also apply a very rapid conductive cooling to the workpiece support structure to further reduce thermal budget. The workpiece can also be held such that the device side surface can be in a vertical orientation, and the energy pulse can be incident from a horizontal direction. Such configuration can prevent gravity from causing workpiece deflection.

In some embodiments, the energy pulse can have a pulse duration that can be less than a thermal conduction time for heat from the energy pulse to diffuse through thickness of the workpiece. In some embodiments, the pulse duration can be less than about 100 ms in semiconductor workpiece processing applications. In some embodiments, the pulse duration can be less than about 30 ms. In some embodiments, the pulse duration can be in the range of about 0.1 ms to about 100 ms, such as in the range of about 2 ms to about 100 ms, such as in the range of about 5 ms to about 30 ms.

Examples of a heat source that can deliver the energy pulse can include a flash-lamp, an arc lamp, a laser, other heat source that can produce particle beams (e.g. electron, ion beams, etc.), chemical reactions, flames, microwave, or radio frequency (RF), etc. In some embodiments, the energy pulse can be delivered simultaneously to the entire non-device side surface of the workpiece, or to one or more portions of the non-device side surface. In some embodiments, the energy pulse can be controlled to scan across the non-device side surface.

In some embodiments, thermal processing according to example embodiments of the present disclosure can produce an acceptable temperature rise (e.g., a rapid temperature rise, but not as large a temperature rise as in typical millisecond anneal processes) at the surface where the energy pulse is delivered. As such, a range of acceptable conditions for delivering the energy pulse to the non-device side surface of the workpiece can be increased. In some embodiments, the pulse duration can be longer, and it is not necessary that the energy is absorbed very close to the non-device side surface. As such, a wider range of types of heat sources that deliver the energy pulse can be used. For reasonable heating efficiency, the energy pulse can be mainly absorbed within the thickness of the workpiece, and the pulse can have durations below about 100 ms. In some embodiments, the energy pulse can be delivered to the non-device side surface of the workpiece, rather than the device side surface of the workpiece using the heat sources mentioned above. In some embodiments, scanning an energy beam over the non-device side surface of the workpiece can be used. The scanned energy beam can be produced by scanned lasers that can include relatively high efficiency sources, such as diode lasers, fiber lasers and carbon dioxide ($CO_2$) lasers, some combinations thereof, etc.

In some embodiments, cooling of the workpiece after the energy pulse has been delivered can be accelerated in various manners, including by having either the device side surface, the non-device side surface, and/or both surfaces of the workpiece in thermal contact with a heat-sink structure that can allow heat to be conducted away to the heat sink(s) through gap between the workpiece and the heat sink(s). In some embodiments, a high thermal conductivity medium can be used between the workpiece and the heat sink(s). Examples of the high thermal conductivity medium can include a gas, such as helium (He) or hydrogen ($H_2$) to accelerate cooling rate. Alternatively, if the workpiece can be only supported at a few locations, and there can be no cooler surfaces nearby, then heat can be lost from surfaces by convection and/or conduction into gas ambient surrounding the workpiece, and/or by emission of thermal radiation.

In some embodiments, the methods and systems according to example aspects of the present disclosure can provide a number of technical effects and benefits. For instance, the methods and systems can limit undesired byproducts of thermal processes. The methods and systems can restrict diffusion of dopant atoms that can occur during an annealing process, such as annealing of ion-implantation damage. The methods and systems can also limit other undesirable effects, such as diffusion of metal species, excessive oxidation of a surface or interface in a device structure, etc.

Processing a workpiece by delivering an energy pulse (e.g., irradiance flash) to a non-device side surface of the workpiece according to example embodiments of the present disclosure can reduce a peak width of a heating profile. The peak width can describe a time interval when the non-device surface can be at or above a reference temperature that can be obtained from subtracting a temperature value (e.g., 50K, etc.) from a peak temperature ($T_{peak}$) of the temperature time profile. For instance, a 50K peak width is defined as a time interval where a temperature of the surface of the workpiece is above $T_{peak}$–50K. A 100K peak width is defined as a time interval where a temperature of the surface of the workpiece is above $T_{peak}$–100K.

The reduced peak width obtained using thermal processing according to example aspects of the present disclosure can allow the thermal processing to achieve effective annealing cycles at relatively high temperatures while still reducing undesirable processes, such as excessive dopant diffusion. Fast heating that results from heating the non-device side surface with the energy pulse can allow the peak width to be reduced substantially.

In some embodiments, thermal processing according to example aspects of the present disclosure can be implemented in relatively low peak temperature recipes, where conventional systems often have to employ greatly reduced ramp rates to prevent excessive temperature overshoot and non-uniformity problems. As such, thermal processing according to example aspects of the present disclosure can be used for spike anneals with peak temperatures below about 900° C., and even as low as about 100° C.

In some embodiments, thermal processing according to example aspects of the present disclosure can combine heating based on the energy pulse with rapid conductive heat loss to accelerate cooling process after the energy pulse can be delivered. As such, thermal processing according to example aspects of the present disclosure can allow an overall peak width (e.g., 50K peak width) to be substantially reduced. In some embodiments, thermal processing according to example embodiments of the present disclosure can be used without any preheating, such as a workpiece starting off at room temperature (e.g., about 20° C.).

In some embodiments, thermal processing according to example aspects of the present disclosure can effectively provide a very high ramp rate spike anneal while eliminating any pattern effects arising from non-uniform absorption of heating energy in different parts of a patterned device(s) on the device side surface of the workpiece. This non-uniform absorption, often called "pattern effect," can be a difficult problem for device uniformity after spike annealing. According to example aspects of the present disclosure, the energy pulse can be delivered to the uniform non-device surface of the workpiece that does not have device structures. As such, the energy absorption is not affected by any optical effects from the device structures or other layers and materials on the device side structure of the workpiece. The energy pulse can be more uniformly absorbed within the thickness of the workpiece, leading to more uniform delivery of heating energy to the device side surface of the workpiece.

In some embodiments, the non-device surface of the workpiece can also be coated or modified to affect the nature of the energy absorption on the non-device surface, the device surface, both surfaces of the workpiece, and/or within the workpiece. In some embodiments, the non-device surface can be coated with an anti-reflective coating (e.g., coated with one or more films of silicon dioxide and/or silicon nitride) to increase the energy absorption and to make the heating process more efficient.

In some embodiments, the non-device surface can be coated by patterning a film(s) (e.g., an anti-reflective coating) in a manner that can lead to desired non-uniform absorption of the energy pulse, such as creating a non-uniform spike heating process at the device side surface of the workpiece. This can be desirable in a semiconductor device manufacturing process where a non-uniform temperature distribution in a spike anneal stage can help to compensate for a known non-uniformity in a different manufacturing step, such as doping, etching or deposition step. In some embodiments, the example embodiments of the present disclosure can alter the effects from a complex non-uniformity distribution such as a pattern effect (from any manufacturing process) by creating a deliberate, compensating, pattern effect in energy pulse absorption of the non-device side surface.

It can be difficult for conventional spike annealing to achieve non-uniform spike heating process with temperature changes over a length scale of less than about 1 centimeter (cm) by tuning a spatial distribution of lamp irradiation. Because the conventional spike annealing can produce the wider peak width that can have relatively long time, the wider peak width can lead to lateral heat flow that can reduce induced temperature gradient. In contrast, thermal processing according to example aspects of the present disclosure can deliver a part of the heating energy in a non-uniform manner at the non-device surface over a time scale short enough that it leads to a non-uniform spike heating process at the device surface, because the very rapid transfer of the energy through the thickness of the wafer limits the spread of the heat before it reaches the device surface, allowing tuning of temperature distributions over a length scale of the order of 1 millimeter (mm), thereby increasing the spatial resolution.

In some embodiments, the thermal processing according to example aspects of the present disclosure can introduce one or more optical elements (e.g., mask elements) to perform the non-uniform spike heating process. The one or more optical elements can affect spatial distribution of the energy absorption. In some embodiments, a partially transmissive optical plate can act as a mask that can determine distribution of the energy pulse delivered to the non-device side surface of the workpiece. In some embodiments, thermal processing according to example aspects of the present disclosure can perform the non-uniform spike heating process by scanning an energy beam over the non-device side surface of the workpiece, such as varying power, shape, size and/or dwell time of the scanned beam as the beam scanning over the non-device side surface.

In some embodiments, thermal processing according to example aspects of the present disclosure can combine a hot-plate style preheat arrangement with the energy pulse delivered to the non-device side surface of the workpiece. In some embodiments, the workpiece can be loaded onto a hot plate with the device side surface facing the hot plate, but separated from the hot plate by a cushion of gas. In some embodiments, the separation can be from about 0.02 to about 2 mm in size, such that the workpiece can be heated by thermal conduction through the layer of gas, such as nitrogen ($N_2$), Argon (Ar), $H_2$, He, etc. The device side surface may not physically contact the hot plate because the gas flow can provide the physical support (e.g., by the gas flow through small orifices in the hot plate, etc.) combined with suitable exhaust arrangements.

In some embodiments, the workpiece can be facing upwards, with the hot plate above the workpiece, because the gas flow pattern can be arranged to provide a net force upwards to support the workpiece. After the hot plate has heated the workpiece, the energy pulse can be delivered to the non-device side surface of the workpiece, leading to a fast jump in the temperature at the device side surface. After heating based on the energy pulse, the temperature rise in the workpiece can rapidly decrease, because the heat from the energy pulse can rapidly be lost by thermal conduction through the gas to the hot plate. Some heat can also be lost directly from the non-device side surface of the workpiece.

In some embodiments, the workpiece can be supported between two hot plates, and the energy pulse can be delivered through one of the two hot plates. One of the two hot plates can face the non-device side surface of the workpiece and can include a material that can be transparent to the heating energy.

As such, combining the hot plate(s) with heating the non-device side surface by the energy pulse can provide fast conductive cooling through a thin layer of gas (e.g., a layer having relatively high thermal conductivity, or a layer that can speed up the cooling after the energy pulse can be delivered) to lead to an even smaller peak width for a heating profile. Additionally, thermal processing according to example aspects of the present disclosure can reduce pattern effect occurring from the preheating, because the preheat energy and/or energy pulse can be delivered by thermal conduction through a gas. The gas cushion can also provide workpiece support without physical contact. As such, thermal processing with the gas cushion according to example embodiments of the present disclosure can reduce local cooling and/or physical damage at the device side surface of the workpiece.

In some embodiments, thermal processing according to example aspects of the present disclosure can adjust pulse duration, power-time shape and/or other parameters (e.g., arriving time, magnitude, and/or other suitable parameter describing features of the energy pulse) of the energy pulse without adversely affecting a process objective of the spike anneal of the device side surface. This can introduce several important opportunities for making the spike anneal process more effective.

In some embodiments, the temporal shape of the energy pulse can be chosen to reduce thermal stress experienced in the workpiece thermal heating processing. In some embodiments, thermal processing according to example aspects of the present disclosure can reduce heating rate (e.g., by using a staggered-pulse shape, etc.), thereby reducing the workpiece stress. Effect on a heating profile at the device side surface during the spike anneal process can be reduced, since the temperature rise at the device side surface can be mainly determined by the amount of energy absorbed and by the thermal diffusion through the thickness of the workpiece.

In some embodiments, thermal processing according to example aspects of the present disclosure can reduce (e.g., minimize, etc.) thermal budget, including electrical activation of dopants in semiconductors, such as boron (B), gallium (Ga), indium (In), arsenic (As), phosphorous (P) and antimony (Sb) in silicon, germanium, silicon-germanium (SiGe) alloys, and/or SiGeSn alloys, etc. The reduced thermal budget can help reduce the loss of electrical activation that can be experienced in longer anneals.

In some embodiments, thermal processing according to example aspects of the present disclosure can be used in formation of contact structures comprising metals, metal silicides and germanides. In some embodiments, thermal processing according to example aspects of the present disclosure can be used in annealing other films, including dielectrics, other suitable materials that can be affected by thermal exposure, high-dielectric constant materials such as oxides and silicates, e.g., hafnium oxide ($HfO_2$), zirconium dioxide ($ZrO_2$), $HfO_2$ mixtures, $ZrO_2$ mixtures, a range of functional oxide films, etc. In some embodiments, thermal processing according to example aspects of the present disclosure can be employed in processes including surface oxidation, nitridation, chemical vapor deposition, chemical and plasma etching, atomic layer deposition and etching.

In some embodiments, thermal processing according to example aspects of the present disclosure can perform heating processes with reduced thermal budgets at later stages in semiconductor device fabrication, such as middle-of-line, or back-end-of-line steps (such as formation of interconnect layers). The reduced thermal budgets can be used to prevent degrading the delicate device structures, and/or the semiconductor devices themselves. As such, thermal processing according to example aspects of the present disclosure can process conductor films comprising copper (Cu), cobalt (Co) and ruthenium (Ru), and/or liner and diffusion barrier materials and insulators such as low-dielectric constant materials, etc.

In some embodiments, thermal processing according to example aspects of the present disclosure can be used in processing of materials at relatively low temperatures, including polymer films. In some embodiments, thermal processing according to example aspects of the present disclosure can be used for thermal treatment of photoresist layers, including both organic and inorganic forms. In some embodiments, thermal processing according to example aspects of the present disclosure can allow very fast heating cycle to be applied by delivering the energy pulse to the non-device side surface without exposing photo-sensitive material on the device side surface to radiant energy that can affect properties of the device side surface.

In some embodiments, in addition to semiconductor fabrication applications, thermal processing according to example aspects of the present disclosure can be used in fabrication of memory devices, magnetic and photonic devices, light-emitting devices, sensors, batteries, fuel cells, and/or solar cells, etc.

Example embodiments of the present disclosure are directed to a method of processing a semiconductor workpiece. The method can include depositing a layer of semiconductor material onto the semiconductor workpiece at the device side of the semiconductor workpiece. The layer can have an amorphous structure. The method can include doping the layer of semiconductor material with a dopant species and annealing the second layer for crystallization using solid phase epitaxy. During crystallization, the dopant species can become incorporated into crystalline material.

In some embodiments, the method can provide a thin layer of semiconductor with a very high concentration of charge carriers by electrically activating a doped layer. The method can start with a semiconductor workpiece including a semiconductor layer that can be part of a device structure. The semiconductor layer can be silicon, germanium, an alloy of silicon and germanium (e.g., SiGe), an alloy with tin (e.g., SiGeSn), other type of semiconductor such as a III-V semiconductor, etc. The semiconductor layer can be coated by an additional layer of a semiconductor, and the additional layer can have the same material or can have a different composition compared with the semiconductor layer.

In some embodiments, deposition of the semiconductor layer and/or the additional layer can be by evaporation, sputtering, very-low energy ion implantation or cluster deposition, chemical vapor deposition (CVD), atomic layer deposition (ALD), some combination thereof, etc.

In some embodiments, the device side surface of the workpiece can be cleaned before the deposition, such removing contaminants, and/or a native oxide layer of the device side surface. In some embodiments, the cleaning process can exploit exposure to etching species, such as chlorine (Cl), fluorine (F), etc. In some embodiments, the cleaning process can be reducing species such as $H_2$, H radicals and/or ions, other suitable species from a plasma source and/or other source, etc. In some embodiments, the cleaning process can also exploit forming volatile species that can then be removed from the device side surface by desorption, such as by heating, by assistance of energy from ion bombardment, by another source, etc. After the device side surface has been cleaned, the deposition of the semiconductor layer can be performed in a manner that at least a portion of the semiconductor layer can retain an amorphous structure.

For example, in a Si CVD process, the method can keep the workpiece at a relatively low temperature (e.g., below about 600° C.) during the deposition process. In some embodiments, the method can use gas flow rates and pressure that can encourage formation of an amorphous structure rather than a crystalline film during the deposition process.

In some embodiments, while the amorphous structure is being deposited, a dopant species can be simultaneously introduced by providing a dopant-bearing species in gas mixture employed in the deposition process. In some embodiments, phosphorus can be provided by including a species such as phosphine ($PH_3$) in the gas mixture. The resulting amorphous structure can then end up being doped with phosphorus. Other dopants in a silicon film can include B, Ga, In, As, Sb, Bi. The above dopant species can be introduced to SiGe and SiGeSn films. For III-V semiconductors, other dopant species can be employed including magnesium (Mg), zinc (Zn), silicon (Si), selenium (Se), sulfur (S), tellurium (Te) etc. In some embodiments, the amorphous structure can be deposited and then the dopants can be introduced into the amorphous structure (e.g., by ion implantation).

In some embodiments, after the doped amorphous structure has been formed, an annealing step can be performed for crystallization of the amorphous layer. During crystallization, a substantial fraction of the dopants species can become incorporated in crystalline material and electrically active. The crystallization can proceed via solid phase epitaxy (SPE), where the crystalline semiconductor under the amorphous structure can act as a seed for crystalline regrowth. For silicon, the SPE regrowth can occur at temperatures from around 400° C. up to the melting point. In some embodiments, the method can melt the amorphous structure by delivering an energy pulse from a heat source (e.g., a laser, etc.) and/or by incorporating dopants as the amorphous layer can freeze back.

In some embodiments, the method can perform the crystallization by SPE during an annealing process where the workpiece is heated to a peak temperature in a range of about 400° C. to about 1300° C. The anneal can be a soak, spike, a millisecond anneal, other suitable anneal, etc. The method can allow the use of relatively high temperatures for the SPE regrowth with limiting electrical deactivation phenomena.

In some embodiments, for a millisecond anneal, the workpiece can be preheated to a temperature in a range of about 250° C. to about 600° C. and can be heated based on the energy pulse to a peak temperature in a range of about 600° C. to about 1300° C. by a pulse duration in a range of about 0.1 ms to about 10 ms. The method can perform the SPE regrowth by providing a heat cycle with a peak temperature in a range from about 650° C. to about 850° C. In some embodiments, the heat cycle can include providing an energy pulse to a non-device side surface of the workpiece according to example embodiments of the present disclosure.

One example aspect of the present disclosure is directed to a method for thermal processing of a workpiece. The method can include placing the workpiece in a thermal processing chamber. The workpiece can include a device side surface and an opposing non-device side surface. The workpiece can have a thickness between the device side surface and the opposing non-device side surface. The method can include delivering an energy pulse from at least one heat source to the non-device side surface of the workpiece. The energy pulse can have a pulse duration. The pulse duration can be less than a thermal conduction time for heat from the energy pulse to diffuse through the thickness of the workpiece and is such that a rate of heating the device side surface is greater than 1000 K/s. A rate of cooling the device side surface can be less than about 1000 K/s.

Variations and modifications can be made to this example aspect of the present disclosure. For instance, the device side surface can include one or more device structures, films, or layers that are annealed during the energy pulse. The non-device side surface can include no device structures.

The at least one heat source can be an arc lamp or a laser. The pulse duration can be less than about 100 ms, such as less than about 30 ms, such as greater than about 0.1 ms and less than about 100 ms, such as greater than about 5 ms and less than about 30 ms. The pulse duration can be such that a 50° temperature peak width of a temperature of the device side surface is about 1.3 seconds or less, such as about 0.5 seconds or less.

Prior to delivering the energy pulse, the method can include heating the workpiece to an intermediate temperature. The intermediate temperature can be in the range of about 20° C. to about 800° C. Heating the workpiece to the intermediate temperature can include heating the device side surface of the workpiece.

The energy pulse can cause the device side surface to have a peak temperature in the range of about 40% to about 80% of a peak temperature of the non-device side temperature. For instance, the energy pulse can cause the non-device side surface to have a peak temperature of about 1200° C. and the device side surface to have a peak temperature of about 850° C. The energy pulse can include a first energy pulse and a second energy pulse. The second energy pulse occurring during the first energy pulse.

The non-device side surface of the workpiece can include a compensating film. One or more compensating properties of the compensating film can correspond to non-uniform characteristics of one or more device structures on the device side surface. The compensating film can include, for instance, a reflective coating. A mask structure can be disposed between the at least one heat source and the non-device side surface.

The device side surface and/or the non-device side surface can be in thermal communication with a heat sink. The heat sink can include a hot plate in the thermal processing chamber. The method can include supporting the workpiece on a gas cushion disposed between the hot plate and the workpiece. The gas cushion can have a thickness of about 0.02 mm to about 2 mm. Prior to delivering the energy pulse, the method can include heating the workpiece to an intermediate temperature with the hot plate. A second hot plate can be disposed proximate the non-device side surface of the workpiece. The workpiece can be supported at least in part by a second gas cushion between the second hot plate and the workpiece.

The device side surface can include a device structure having a doped amorphous film. The energy pulse applied to the non-device side surface of the workpiece can anneal the doped amorphous film for crystallization of the doped amorphous film. The crystallization can be implemented at least in part using solid phase epitaxy during anneal. The energy pulse can result in a peak temperature of the device side surface of the workpiece to be in the range of about 650° C. to about 850° C.

Another example aspect of the present disclosure is directed to a method for processing a workpiece in a thermal processing system. The workpiece can include a device side surface and a non-device side surface separated by a thickness. The method can include placing a workpiece on a workpiece support in a processing chamber of the thermal processing system such that the non-device side surface faces one or more arc lamps. The method can include heating the workpiece to an intermediate temperature using one or more heat sources. The method can include providing an irradiance flash to the non-device side surface of the workpiece using the one or more arc lamps. The irradiance flash can have a duration of less than about 100 ms such that a rate of heating the device side surface is greater than 1000 K/s and a rate of cooling the device side surface is less than about 1000 K/s. For instance, the irradiance flash can have a duration of less than about 30 ms.

Variations and modifications can be made to this example aspect of the present disclosure. For instance, the irradiance flash can create a temperature gradient between the device side surface of the workpiece and the non-device side surface of the workpiece. The irradiance flash causes the non-device side surface to achieve a peak temperature of about 1200° C.

The irradiance flash can cause the device side surface to have a 50° temperature peak width of about 1.3 seconds or less, such as about 0.5 second or less, such as between about 0.4 second and about 1.3 seconds. The irradiance flash can cause the device side surface to have a peak temperature of about 850° C. The irradiance flash can include a first irradiance flash and a second irradiance flash. The first irradiance flash occurring during the second irradiance flash.

Another example aspect of the present disclosure is directed to a method for processing a semiconductor workpiece. The method can include depositing a layer of semiconductor material onto the semiconductor workpiece at the device side of the semiconductor workpiece. The layer can have an amorphous structure. The method can include doping the layer of semiconductor material with a dopant species. The method can include annealing the layer for crystallization using solid phase epitaxy. During crystallization, the dopant species can become incorporated into crystalline material.

Variations and modifications can be made to this example aspect of the present disclosure. For instance, doping the layer can occur during depositing of the layer. Doping the layer can occur after depositing of the layer using ion implantation.

The anneal can be a soak anneal, spike anneal, or a millisecond anneal. Anealing can include heating the workpiece to an intermediate temperature in the range of about 250° C. to about 600° C.; and providing an energy pulse to the workpiece to heat the device side surface of the workpiece to a peak temperature in the range of about 600° C. and 1300° C. The energy pulse has a duration in the range of about 0.1 ms to about 10 ms.

The layer can include germanium, silicon or silicon germanium and is deposited on a silicon containing material or silicon germanium containing material. The dopant species can include phosphorous, boron, gallium, indium, arsenic, antimony, or bismuth. The layer can be deposited onto a second layer of a different semiconductor material relative to the layer.

The layer can be a III-V semiconductor material and can be deposited on a III-V semiconductor material. The dopant species is manganese, zinc, silicon, selenium, tellurium, or sulfur.

Variations and modifications can be made to these example embodiments of the present disclosure. As used in the specification, the singular forms "a," "and," and "the" include plural referents unless the context clearly dictates otherwise. The use of "first," "second," "third," and "fourth" are used as identifiers and are directed to an order of processing. Example aspects may be discussed with reference to a "substrate," "wafer," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

Figure 2:
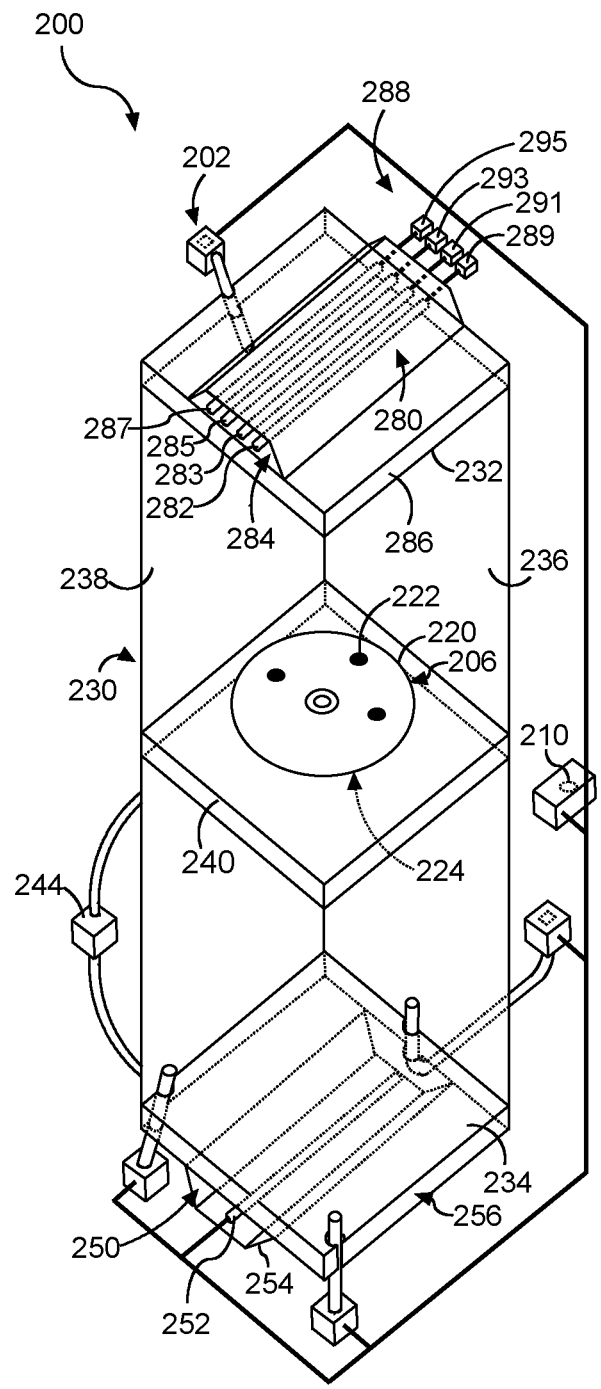
FIGS. 2 and 3 depict thermal processing systems according to example embodiments of the present disclosure.
Figure 3:
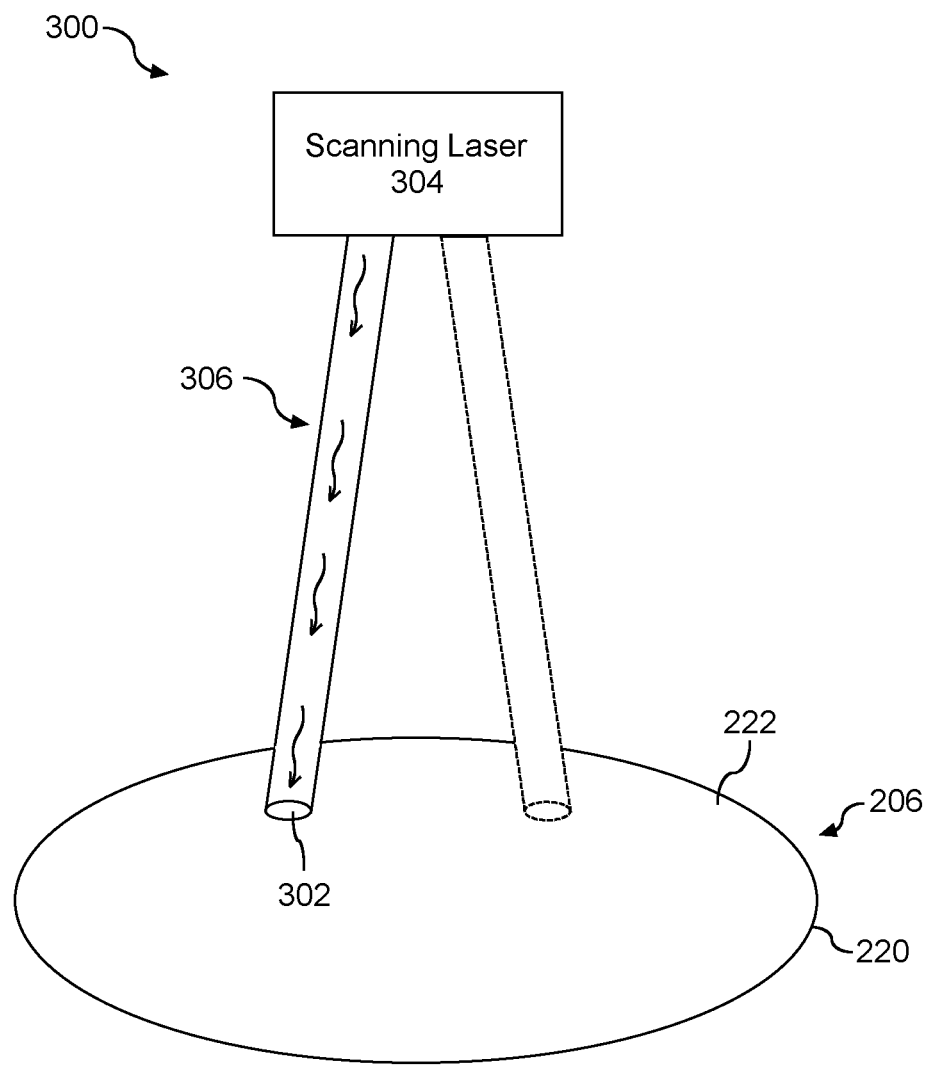

With reference now to the FIGS., example embodiments of the present disclosure will now be discussed in detail. FIGS. 2 and 3 depict example thermal processing systems 200 and 300 according to example embodiments of the present disclosure. As shown in FIG. 2, the thermal processing system 200 can include an energy pulse (e.g., irradiance flash, etc.) generating system 280 and a processor circuit 210.

The thermal processing system 200 can process a workpiece 206. The workpiece 206 can be the workpiece 50 in FIG. 1. In this example embodiment of FIG. 2, the workpiece 206 can be a semiconductor workpiece 220. For example, the semiconductor workpiece 220 can be a silicon semiconductor wafer (in this example, 300 mm diameter) for use in the manufacture of semiconductor chips, such as microprocessors, memory devices, etc. The workpiece 206 can include a non-device side surface 222 (e.g., a top side) and a device side surface 224 (e.g., a back-side).

The energy pulse generating system 280 can deliver an energy pulse to the non-device side surface 222 of the workpiece 206. As shown in FIG. 2, the energy pulse generating system 280 can include a first heat source 282, a second heat source 283, a third heat source 285, a fourth heat source 287, and a reflector system 284 that can be positioned immediately above a water-cooled window 286 of a processing chamber 230. The heat sources 282, 283, 285, and 287 are arc lamps configured to provide an irradiance flash to the workpiece 206. However, other suitable heat sources can be used without deviating from the scope of the present disclosure. In some embodiments, the energy pulse can be delivered simultaneously to the entire non-device side surface 222 of the workpiece 206, or to one or more portions of the non-device side surface 222.

In some embodiments, the energy pulse generating system 280 can include fewer than four heat sources, such as a single heat source. In some embodiments, the energy pulse generating system 280 can include more than four heat sources, such as an array of a much larger number of heat sources.

In some embodiments, the reflector system 284 can uniformly irradiate the non-device side surface 222 of the workpiece 206 when the two outer heat sources (e.g., the first and fourth heat sources 282 and 287) are fired simultaneously. In some embodiments, the reflector system 284 can uniformly irradiate the non-device side surface 222 of the workpiece 206 when either of the two inner heat sources (e.g., either the second heat source 283 or the third heat source 285) is fired in isolation.

As shown in FIG. 2, the energy pulse generating system 280 can further include a power supply system 288 for supplying electrical power to the heat sources 282, 283, 285 and 287 to produce the energy pulse (e.g., the irradiance flash, etc.). The power supply system 288 can include individual electrical power supply systems 289, 291, 293 and 295, for supplying electrical power to the individual heat sources 282, 283, 285 and 287, respectively. In some embodiments, each of the electrical power supply systems 289, 291, 293 and 295 of the power supply system 288 can act as a power supply system for a respective one of the heat sources 282, 283, 285 and 287, and can include a pulsed discharge unit that can be pre-charged then abruptly discharged in order to supply a "spike" of input power to the respective heat source to produce the desired energy pulse (e.g., irradiance flash, etc.).

The processor circuit 210 can control the energy pulse generating system 280 to deliver the energy pulse to the non-device side surface 222 (e.g., the entire non-device side surface, or one or more portions of the non-device side surface) of the workpiece 206. In some embodiments, the processor circuit 210 can control the pulse duration of the energy pulse to be less than a thermal conduction time for heat from the energy pulse to diffuse through the thickness of the workpiece 206. The processor circuit 210 can also control the pulse duration of the energy pulse such that a rate of heating the device side surface can be greater than 1000 K/s, and a rate of cooling the device side surface can be less than about 1000 K/s.

In some embodiments, the processor circuit 210 can control a pulse duration of the energy pulse to be less than about 100 ms (e.g., in semiconductor workpiece processing applications). In some embodiments, the processor circuit 210 can control the pulse duration of the energy pulse to be less than about 30 ms. In some embodiments, the processor circuit 210 can control the pulse duration of the energy pulse to be greater than about 0.1 ms and less than about 100 ms, such as in a range of about 2 ms to about 100 ms. In some embodiments, the processor circuit 210 can control the pulse duration of the energy pulse to be greater than about 5 ms and less than about 30 ms.

In some embodiments, the processor circuit 210 can adjust the pulse duration, power-time shape and/or other parameters (e.g., arriving time, magnitude, and/or other suitable parameter describing features of the energy pulse) of the energy pulse without adversely affecting a process objective of an anneal process (e.g., soak anneal, spike anneal, or a millisecond anneal, etc.) of the device side surface 224.

As shown in FIG. 2, the thermal processing system 200 can further include a pre-heating system 250 for pre-heating the workpiece 206. The pre-heating system 250 can include a continuous mode heat source 252 (e.g., an arc lamp, other suitable lamp, other suitable heat source, etc.) and a reflector system 254 disposed beneath the water-cooled window 256. Prior to delivering the energy pulse to the non-device side surface 222, the continuous mode heat source 252 can heat the workpiece 206 to reach an intermediate temperature with the workpiece support 240. In some embodiments, heating the workpiece to the intermediate temperature can be accomplished through the device side surface 224 at a ramp rate which can heat the entire bulk of the workpiece 206. In some embodiments, the processor circuit 210 can control the pre-heating system 250 to preheat the workpiece 206 to reach an intermediate temperature.

In some embodiments (not shown in FIG. 2), the pre-heating system 250 can be on the same side of the energy pulse generating system 280. Both the pre-heating and the energy pulse can be delivered to the non-device side surface 222. For example, prior to delivering the energy pulse to the non-device side surface 222, the continuous mode heat source 252 can heat the workpiece 206 through the non-device side surface 222 to reach an intermediate temperature.

As shown in FIG. 2, the thermal processing system 200 can include a workpiece support 240 (e.g., a hot plate, etc.) located below the workpiece 206 to support the workpiece 206. The workpiece support 240 can include a gas cushion that can be a high thermal conductivity medium. The workpiece 206 can be loaded onto the workpiece support 240 with the device side surface 224 facing the workpiece support 240, but separated from the workpiece support 240 by the gas cushion. In some embodiments, the gas cushion can have a thickness of about 0.02 mm to about 2 mm in size, such that the workpiece 206 can be heated by thermal conduction through the gas cushion, such as $N_2$, Ar, $H_2$, He, etc. The device side surface 224 may not physically contact the workpiece support 240 because the gas flow can provide the physical support (e.g., by the gas flow through small orifices in the workpiece support 240, etc.) combined with suitable exhaust arrangements.

In some embodiments (not shown in FIG. 2), the thermal processing system 200 can include an additional workpiece support that can be disposed proximate the non-device side surface 222 of the workpiece 206. The additional workpiece support can include an additional gas cushion between the non-device side surface 222 and the workpiece support 240 to support the workpiece 206. In some embodiments, the additional workpiece support can be transparent to heating energy from the energy pulse.

In some embodiments (not shown in FIG. 2), the workpiece support 240 can be located above the workpiece 206, because the gas cushion can be arranged to provide a net force upwards to support the workpiece. In such configuration, the workpiece 206 can be facing upwards. The energy pulse generating system 280 can be located at the bottom of the thermal processing system 200, and the pre-heating system 250 can be located on the top of the thermal processing system 200.

In some embodiments, the workpiece support 240 can be a heat sink such that the workpiece support 240 can be in thermal conduction with the device side surface 224 and/or the non-device side surface 222 to facilitate cooling process for thermal processing the workpiece 206. In some embodiments, after heating based on the energy pulse, the temperature rise in the workpiece 206 can rapidly decrease, because heat from the energy pulse can rapidly be lost by thermal conduction through the gas cushion to the workpiece 206. Some heat can also be lost directly from the non-device side surface 222 of the workpiece 206.

As such, combining the workpiece support 240 with heating the non-device side surface 222 by the energy pulse can provide fast conductive cooling through the gas cushion to lead to an even smaller peak width for a heating profile.

Additionally, because the preheat energy and/or energy pulse can be delivered by thermal conduction through the gas cushion, pattern effect occurring from the pre-heating can be reduced. The gas cushion can also provide workpiece support 240 without physical contact. As such, local cooling and/or physical damage at the device side surface 224 of the workpiece 206 can be reduced.

As shown in FIG. 2, the processing chamber 230 can include top and bottom selectively radiation-absorbing walls 232 and 234, which can include selectively absorbing water-cooled windows 286 and 256, respectively. The processing chamber 230 can also include specularly reflective side walls, two of which are shown at 236 and 238 and the other two of which can be removed for illustrative purposes.

As shown in FIG. 2, the thermal processing system 200 can further include a cooling system 244, and a measurement system 202. The cooling system 244 can include a circulated water cooling system, and can serve to cool the various surfaces of the processing chamber 230. The measurement system 102 can be used to measure temperatures of the non-device side surface 222 and/or the device side surface 224.

In some embodiments, the thermal processing system 200 can perform one or more thermal processes (e.g., a soak anneal, spike anneal, a millisecond anneal, or rapid thermal processing, etc.). Examples are further described in FIGS. 4 and 9.

In some embodiments, the thermal processing system 200 can perform one or more deposition and/or doping processes. Examples are further described in FIG. 10.

FIG. 3 depicts a thermal processing system 300 according to another example embodiment of the present disclosure. As shown in FIG. 3, the energy pulse generating system 280 can include a scanning laser 304 as a heat source. Examples of the scanning laser 304 can include a diode laser, a fiber laser, a carbon dioxide ($CO_2$) laser, other suitable laser that can scan a laser beam, or some combinations thereof. The scanning laser 304 can generate a laser beam 306. The processor circuit 210 can generate an energy pulse to the non-device side surface 222 of the workpiece 206 according to example embodiments of the present disclosure by controlling the scanning laser 304 to scan the laser beam 306 across an area 302 (e.g., a small portion of the non-device surface 222) within less than the thermal conduction time of the workpiece 206.

In some embodiments, the scanning laser 304 can scan the laser beam 306 across the non-device side surface 222 in progressive line scans, so that the laser beam 306 can sweep across the area 302 in less than the thermal conduction time of the workpiece 206, and can scan across each adjacent area on the same scanning line as the area 302 in less than the thermal conduction time of the workpiece 206. The laser beam 306 can scan across successive lines on the non-device side surface 222 until each individual area on the non-device side surface 222 has been scanned by the laser beam 306 in less than the thermal conduction time of the workpiece 206. Thus, the laser beam 306 can heat each such area rapidly, while the bulk of the workpiece 206 beneath the area remains at a relatively cold intermediate temperature, thereby acting as a heat sink to facilitate rapid cooling of the area after the laser beam 306 has scanned over it.

In some embodiments, the scanning laser 304 can perform a non-uniform thermal process by varying the laser beam 306 to scan over the non-device side surface 222 of the workpiece 206, such as varying power, shape, size and/or dwell time of the scanned beam as the beam scanning over the non-device side surface 222. The non-uniform thermal processing on the non-device side surface 222 can lead to a desired non-uniform absorption of the energy pulse, such as creating a non-uniform thermal process at the device side surface 224 of the workpiece 206.

In a conventional spike anneal, a heating ramp can be at 250 K/s, and a cooling rate from a temperature (e.g., 1000° C., etc.) can be limited to about 140 K/s. For radiative pre-heating with tungsten halogen lamps, there can be an additional delay associated with thermal mass of the tungsten filaments. The net result can be that a 50K peak width of a heating profile of the conventional spike anneal can be difficult to reduce below 1.2 seconds. If arc lamps are used in a conventional spike anneal, lamp delay can be reduced. However, the 50 k peak width of the heating profile for conventional spike anneal with arc lamps can be difficult to reduce below 0.6 seconds.

In contrast, if the arc lamps are used for preheating, the thermal processing system 200 can produce a peak width of a heating profile to be less than about 0.4 seconds, because heating ramp time can be made negligible compared to cooling time.

Figure 4:
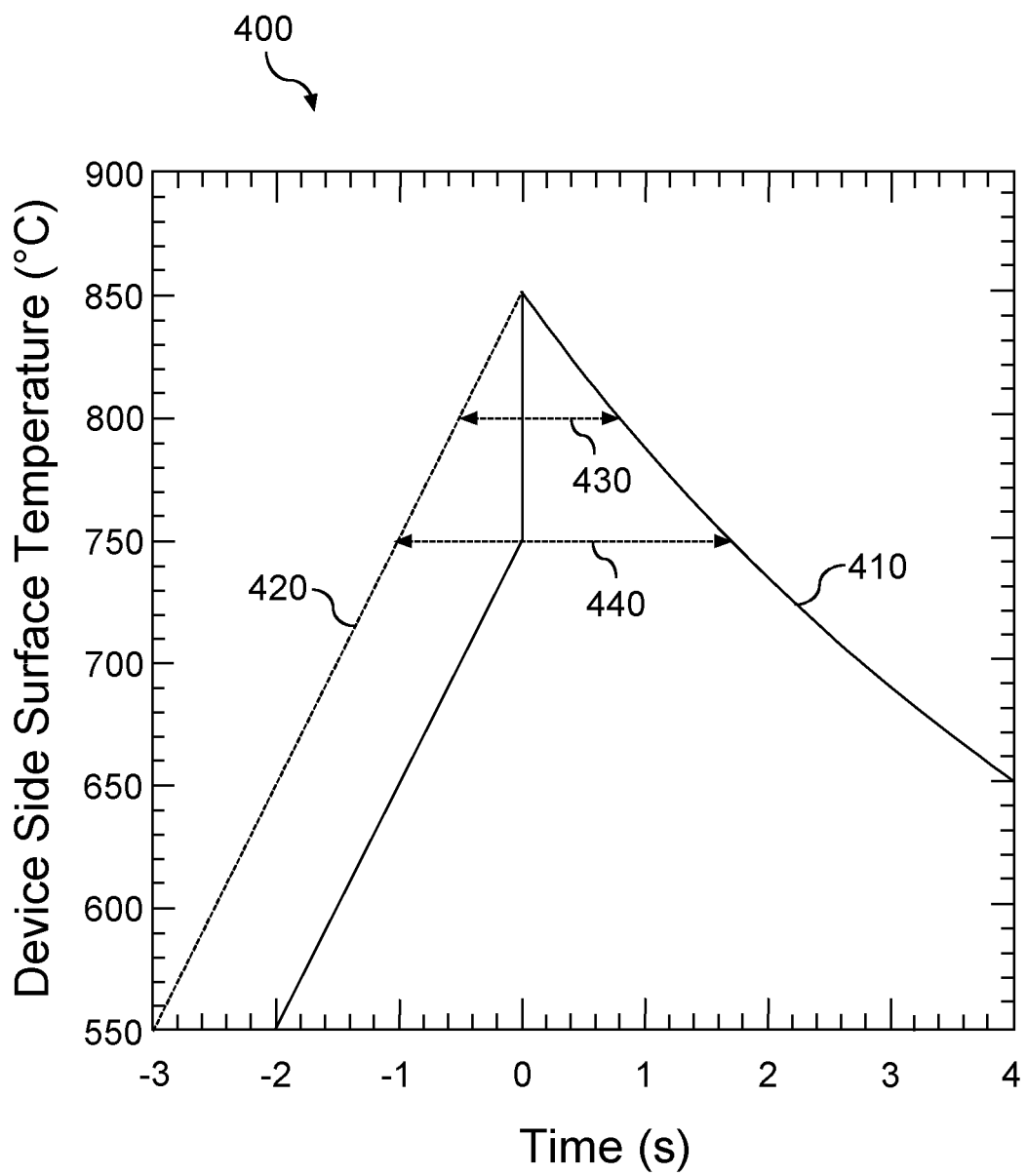
FIG. 4 depicts an example heating profile according to example embodiments of the present disclosure.

FIG. 4 depicts an example anneal heating profile 400 according to example embodiments of the present disclosure. As shown in FIG. 4, a heating profile 410 (solid-line curve) can be generated by the thermal processing system 220 delivering an energy pulse to a non-device side surface of a workpiece. A heating profile 420 (dash-line curve) can be generated by a conventional spike anneal. Heating profile 420 can use an arc lamp as a heat source to heat the workpiece 206 such that the workpiece 206 can have a peak temperature of about 850° C. In the conventional spike anneal, the thermal processing system 200 can deliver an energy pulse to the device side surface 224 of the workpiece 206 when the workpiece 206 can be ramped to a $T_i$ of about 750° C. The energy pulse can raise a peak temperature of the device side surface 224 of the workpiece 206 to about 850° C. The conventional spike anneal can have a 50° temperature (e.g., 50K) peak width 430 of the heating profile 420 of the device side surface 224 at about 1.3 seconds, and have a 100° temperature (e.g., 100K) peak width 440 of the heating profile 420 of the device side surface 224 at about 2.6 seconds. In contrast, heating profile 410 can have a 50° temperature (e.g., 50K) peak width of the heating profile 410 of the device side surface 224 at about 0.7 seconds or less, and have a 100° temperature (e.g., 100K) peak width of the heating profile 410 of the device side surface 224 at about 1.6 seconds or less.

Figure 5:
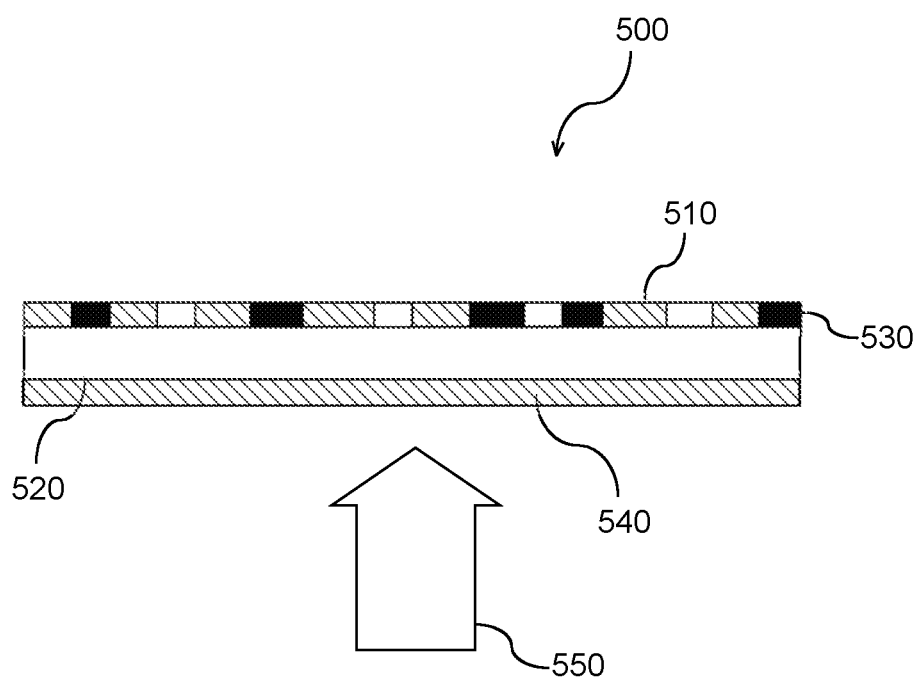
FIGS. 5, 6 and 7 depict example workpieces that can be used in a thermal processing system according to example embodiments of the present disclosure.

FIGS. 5, 6, 7 and 8 depict example workpieces that can be used in the thermal processing system 200 according to example embodiments of the present disclosure. FIG. 5 shows a first example workpiece 500 according to example embodiments of the present disclosure. The workpiece 500 that can have a device side surface 510 and a non-device surface 520. The device side surface 510 can have one or more device structures 530. The non-device side surface 520 can include a film 540 that can increase heat absorption to make heating process more efficient. In some embodiments, the film 540 can include an anti-reflective coating (e.g., coated with one or more films of silicon dioxide and/or silicon nitride). In some embodiments, the film 540 can be a compensating film (e.g., a reflective coating, an anti-reflective coating, etc.) that can have a heat absorption corresponding to a heat absorption of the device structure layer 530 on the device side surface 510. An energy pulse 550 can be delivered to the non-device side surface 520 through the film 540.

Figure 6:
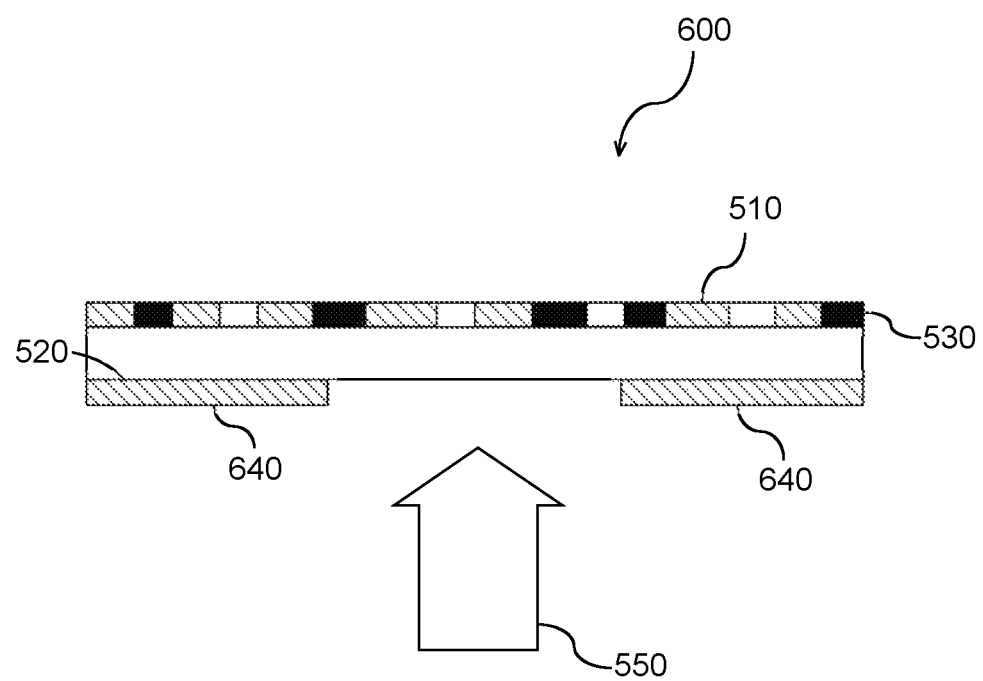

FIG. 6 shows a second example workpiece 600 according to example embodiments of the present disclosure. Compared with the first example 500, instead of coating the film 540 onto the entire non-device side surface 520, the non-device side surface 520 can have a patterned film 610 (e.g., an anti-reflective coating, a reflective coating, etc.) that can lead to a desired non-uniform absorption of the energy pulse 550, such as creating a non-uniform spike heating process at the device side surface 510 of the workpiece 600.

Figure 7:
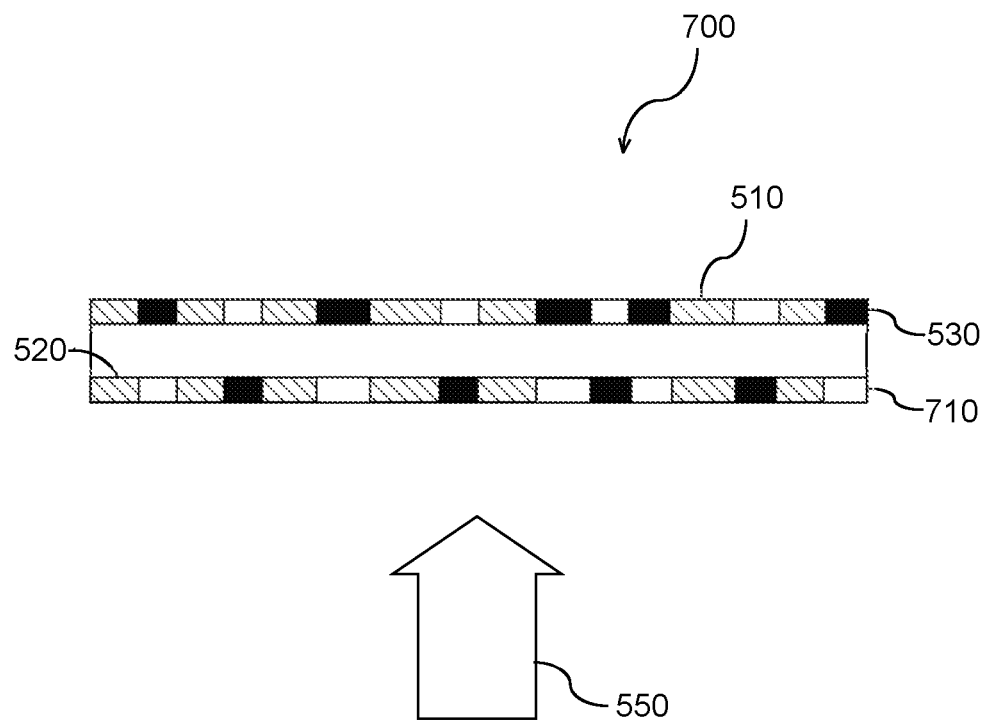

FIG. 7 shows a third example workpiece 700 according to example embodiments of the present disclosure. The workpiece 700 can have a compensating patterned film 710 (e.g., a reflective coating, an anti-reflective coating, etc.) on the non-device side surface 520. The compensating patterned film 710 can have compensating properties that are properties leading to a desired non-uniform temperature distribution within the device side surface 510 to compensate for effects that are caused by one or more manufacturing processes on electrical characteristics of the device side surface 510. In some embodiments, the compensating patterned film 710 can have compensating properties corresponding to non-uniform characteristics in the device side surface 510. For example, the compensating patterned film 710 can have a heat absorption corresponding to a heat absorption of the device structures 530 on the device side surface 510. For instance, the patterned film 710 can be patterned to have heat absorption corresponding to the heat absorption of the device structures 530 on the device side surface 510. More particularly, as an example, the patterned film 710 can have an area of weak heat absorption corresponding to or matching to a device with strong heat absorption on the device side surface. As another example, the patterned film 710 can have an area of strong heat absorption corresponding to or matching to a device with weak heat absorption on the device side surface.

Figure 8:
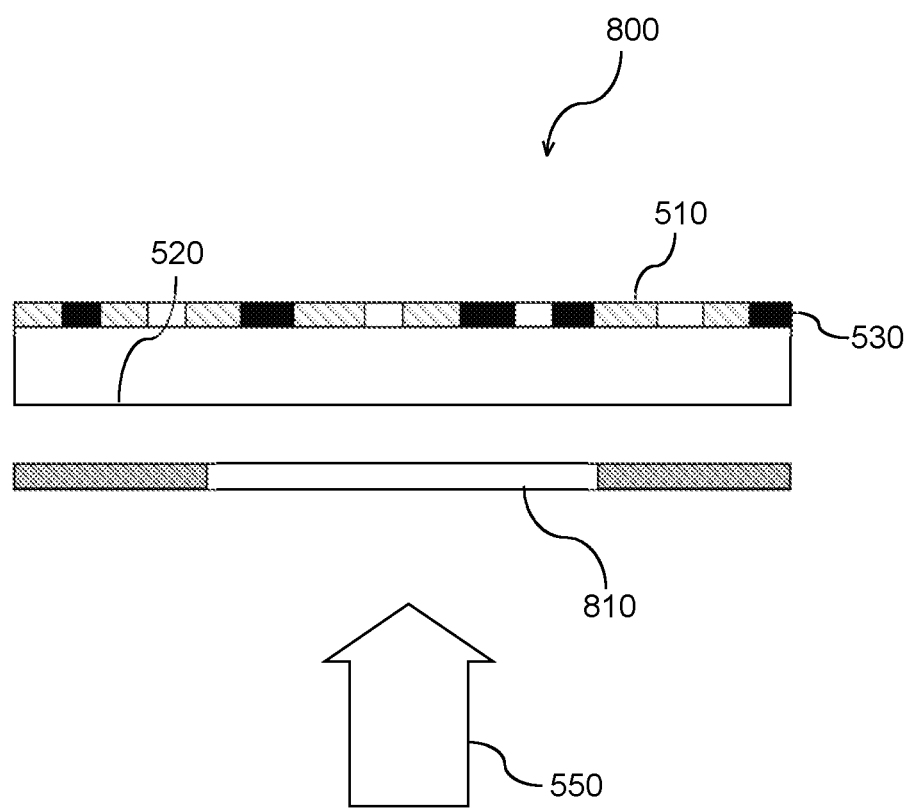
FIG. 8 depicts a heating configuration used in a thermal processing system according to example embodiments of the present disclosure.

FIG. 8 depicts a heating configuration used in a thermal processing system according to example aspects of the present disclosure. In FIG. 8, a mask structure 810 can be disposed between the non-device side surface 520 of a workpiece 800 and the energy pulse generating system 280. In some embodiments, the mask structure 810 can be disposed between the non-device side surface 520 and a heat source that delivers the energy pulse 550 to the non-device surface 520. In some embodiments, the mask structure 810 can include one or more optical elements that can affect spatial distribution of heat absorption. In some embodiments, the mask structure 810 can include a partially transmissive optical plate can that can determine distribution of the energy pulse delivered to the non-device side surface 520 of the workpiece 800.

The above example workpieces 500, 600, 700 and 800 and corresponding structures can be used in the thermal processing system 200 of FIG. 2 and/or in the thermal processing system 300 of FIG. 3.

Figure 9:
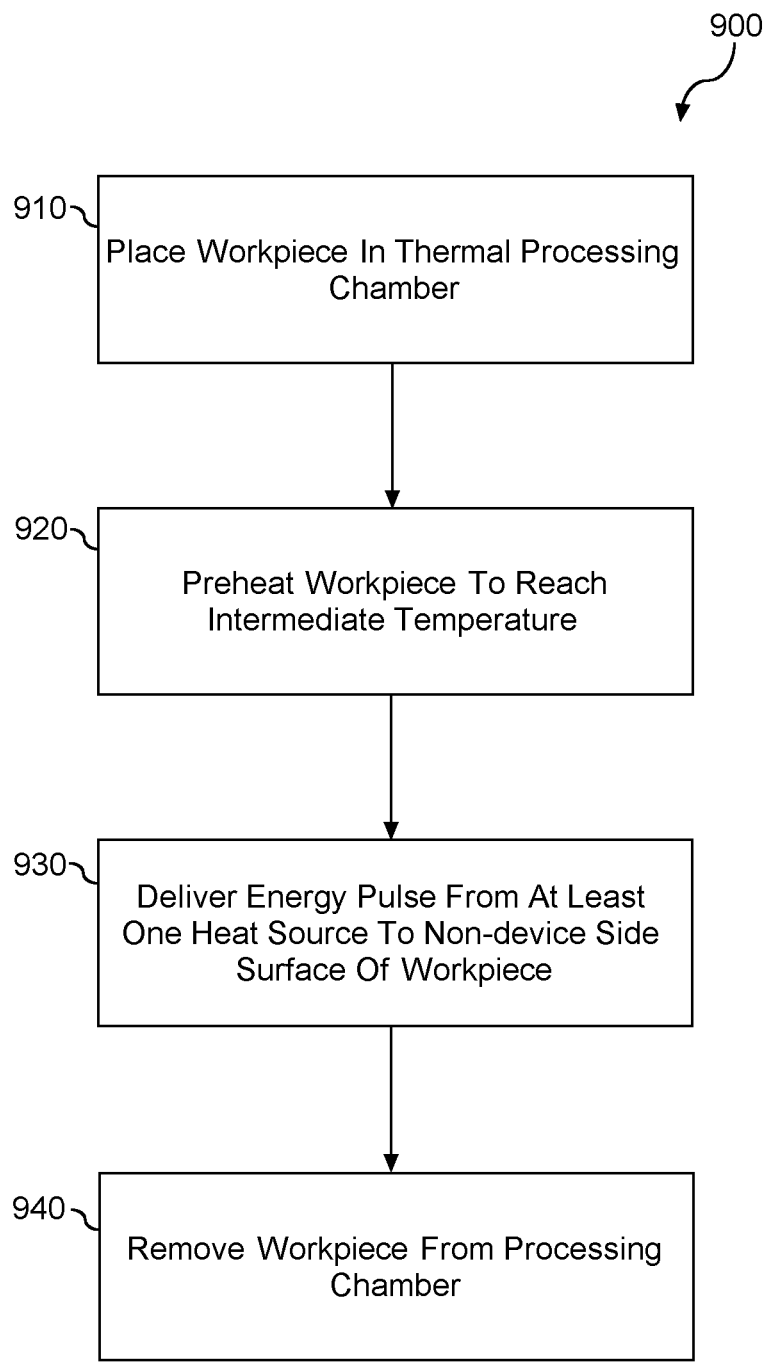
FIG. 9 depicts a flow diagram of an example process for thermal processing of a workpiece according to example embodiments of the present disclosure.

FIG. 9 depicts a flow diagram of an example process 900 for thermal processing of a workpiece according to example embodiments of the present disclosure. The process (900) can be implemented using the thermal processing systems of FIG. 2 or 3. However, as will be discussed in detail below, the process (900) according to example aspects of the present disclosure can be implemented using other thermal processing systems without deviating from the scope of the present disclosure. FIG. 9 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (910), the process can include placing a workpiece in a thermal processing chamber. For example, in the example embodiments of FIGS. 2 and 5-8, the workpiece 206, can be placed on the workpiece support 240 in the processing chamber 230 of the thermal processing system 200.

At (920), the process can include preheating the workpiece to reach an intermediate temperature. For example, in the example embodiments of FIG. 2, the pre-heating system 250 can heat the workpiece 206 from the device side surface 224 to an intermediate temperature (e.g., an intermediate temperature in a range of about a room temperature to about 800° C.) by the continuous mode heat source 252.

At (930), the process can include delivering an energy pulse to a non-device side surface of a workpiece. For example, in the example embodiment of FIG. 2, the energy pulse generating system 280 can deliver an energy pulse to the non-device side surface 222 to produce a rapid temperature rise in the workpiece 206.

In some embodiments, the pulse duration of the energy pulse to be less than a thermal conduction time for heat from the energy pulse to diffuse through the thickness of the workpiece 206. The pulse duration of the energy pulse such that a rate of heating the device side surface can be greater than 1000 K/s, and a rate of cooling the device side surface can be less than about 1000 K/s.

In some embodiments, the pulse duration of the energy pulse can be less than about 100 ms (e.g., in semiconductor workpiece processing applications). In some embodiments, the pulse duration of the energy pulse can be less than about 30 ms. In some embodiments, the pulse duration of the energy pulse can be greater than about 0.1 ms and less than about 100 ms, such as in a range of about 2 ms to about 100 ms. In some embodiments, the pulse duration of the energy pulse can be greater than about 5 ms and less than about 30 ms.

In some embodiments, the energy pulse (e.g., irradiance flash, etc.) can include a first energy pulse and a second energy pulse. The second energy pulse can occur during the first energy pulse. In some embodiments, the energy pulse can cause the device side surface 224 to have a peak temperature in the range of about 40% to about 80% of a peak temperature of the non-device side temperature.

In some embodiments, the energy pulse can cause the non-device side surface 222 to have a peak temperature of about 1200° C. and the device side surface 224 to have a peak temperature of about 850° C. Examples are described above in FIG. 4.

At (940), the process can include removing the workpiece from the processing chamber. For instance, the workpiece 206 can be removed from the thermal processing apparatus 200.

Figure 10:
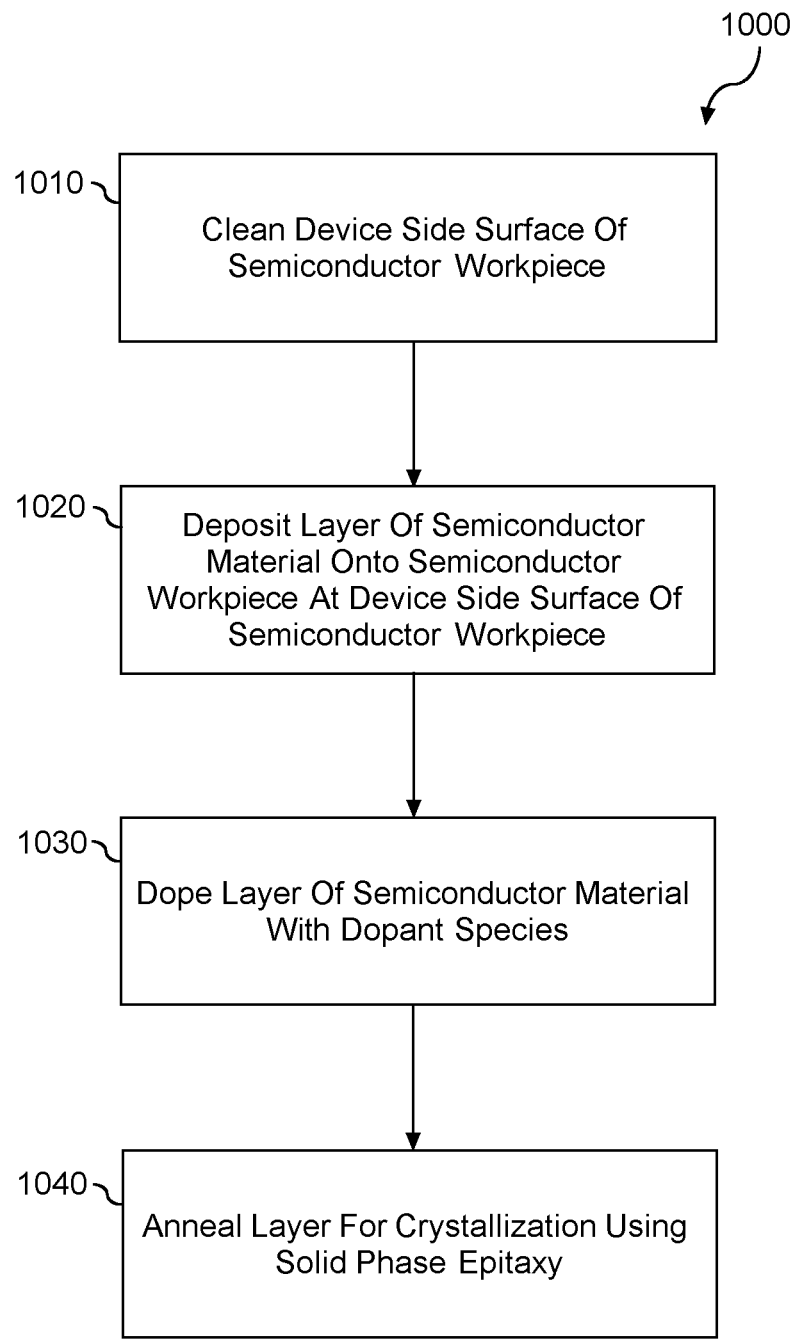
FIG. 10 depicts a flow diagram of an example method for processing a semiconductor workpiece according to example embodiments of the present disclosure.

FIG. 10 depicts a flow diagram of an example method 1000 for processing a semiconductor workpiece according to example embodiments of the present disclosure. The method (1000) can be implemented using the thermal processing systems of FIG. 2 or 3. However, as will be discussed in detail below, the method (1000) according to example aspects of the present disclosure can be implemented using other thermal processing systems without deviating from the scope of the present disclosure. FIG. 10 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (1010), the method can include cleaning a device side surface of the semiconductor workpiece. Cleaning process can exploit exposure to etching species, such as chlorine (Cl), fluorine (F), etc. In some embodiments, the cleaning process can be reducing species such as $H_2$, H radicals and/or ions, other suitable species from a plasma source and/or other source, etc. In some embodiments, the cleaning process can also exploit forming volatile species that can then be removed from the device side surface by desorption, such as by heating, by assistance of energy from ion bombardment, by another source, etc. After the device side surface has been cleaned, the deposition of the semiconductor layer can be performed in a manner that at least a portion of the semiconductor layer can retain an amorphous structure.

At (1020), the method can include depositing a layer of semiconductor material onto the semiconductor workpiece at the device side of the semiconductor workpiece. The layer can include an amorphous structure. Examples of semiconductor material can include silicon, germanium, an alloy of silicon and germanium (e.g., SiGe), an alloy with tin (e.g., SiGeSn), other type of semiconductor such as a III-V semiconductor, etc.

In some embodiments, the layer of semiconductor material can be part of the device side surface of the workpiece. In some embodiments, the device side surface can include an additional layer of semiconductor material as part of the device side surface. The additional layer of semiconductor material can have the same material or can have a different semiconductor material compared with the layer of semiconductor material. For example, the layer can be a III-V semiconductor material and the additional layer can be a III-V semiconductor material.

In some embodiments, deposition of the layer of semiconductor material and/or the additional layer can be by evaporation, sputtering, very-low energy ion implantation or cluster deposition, CVD, ALD, some combination thereof, etc.

At (1030), the method can include doping the layer of semiconductor material with a dopant species. Examples of a doping species can include phosphorus, boron, gallium, indium, arsenic, antimony, or bismuth.

In some embodiments, doping the layer can occur during deposition of the layer. For example, while the amorphous structure is being deposited, a dopant species can be simultaneously introduced by providing a dopant-bearing species in gas mixture employed in the deposition process.

In some embodiments, doping the layer can occur after deposition of the layer using ion implantation. For example, the amorphous structure can be deposited and then the dopant species can be introduced into the amorphous structure (e.g., by ion implantation, plasma exposure/plasma implantation, etc.).

In some embodiments, for III-V semiconductors, the dopant species can be employed including magnesium, zinc, silicon, selenium, sulfur, tellurium, etc.

At (1040), the method can include annealing the layer for crystallization using solid phase epitaxy. During crystallization, the dopant species becomes incorporated into crystalline material. For example, after the doped amorphous structure has been formed, an annealing step can be performed for crystallization of the amorphous layer. During crystallization, a substantial fraction of the dopants species can become incorporated in crystalline material and electrically active.

In some embodiments, the crystallization can proceed via solid phase epitaxy (SPE), where the crystalline semiconductor under the amorphous structure can act as a seed for crystalline regrowth. For silicon, the SPE regrowth can occur at temperatures from around 400° C. up to the melting point. In some embodiments, the method can melt the amorphous structure by delivering an energy pulse from a heat source (e.g., a laser, etc.) and/or by incorporating dopants as the amorphous layer can freeze back.

In some embodiments, the crystallization by SPE can be performed during annealing process where the workpiece is heated to a peak temperature in a range of about 400° C. to about 1300° C. The method can allow the use of relatively high temperatures for the SPE regrowth with limiting electrical deactivation phenomena.

In some embodiments, the annealing process can include a soak anneal, spike anneal, or a millisecond anneal. Examples of annealing process are described in FIGS. 2, 3 and 9.

In some embodiments, during a millisecond anneal process, the workpiece can be preheated to a temperature in a range of about 250° C. to about 600° C. and can be heated based on the energy pulse to a peak temperature in a range of about 600° C. to about 1300° C. by a pulse duration in a range of about 0.1 ms to about 10 ms.

In some embodiments, the method can perform the SPE regrowth by providing a heat cycle with a peak temperature in a range from about 650° C. to about 850° C. In some embodiments, the heat cycle can include providing an energy pulse to a non-device side surface of the workpiece according to example embodiments of the present disclosure.

In some embodiments, prior to the insertion of the workpiece 206 into the processing chamber 230, the device side surface 224 of the workpiece 206 can be subjected to an ion implantation process that can introduce impurity atoms or dopants into a surface region of the device side surface 224 of the workpiece 206. The ion implantation process can damage the crystal lattice structure of the surface region of the workpiece 206, and can leave the implanted dopant atoms in interstitial sites where they are electrically inactive. In order to move the dopant atoms into substitutional sites in the lattice to render them electrically active, and to repair the damage to the crystal lattice structure that occurs during ion implantation, the surface region of the device side surface 224 of the workpiece 206 can be annealed by heat-treating While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for thermal processing of a workpiece, the method comprising:
   placing the workpiece in a thermal processing chamber, the workpiece comprising a device side surface and an opposing non-device side surface, the workpiece having a thickness between the device side surface and the opposing non-device side surface;
   delivering an energy pulse from at least one heat source to the non-device side surface of the workpiece, the energy pulse having a pulse duration;
   wherein the pulse duration is less than a thermal conduction time for heat from the energy pulse to diffuse through the thickness of the workpiece and is such that a rate of heating the device side surface is greater than 1000 K/s;
   wherein a rate of cooling the device side surface is less than about 1000 K/s.

2. The method of claim 1, wherein the device side surface comprises one or more device structures, films, or layers that are annealed during the energy pulse and the non-device side surface includes no device structures.

3. The method of claim 1, wherein the pulse duration is less than about 100 ms.

4. The method of claim 1, wherein prior to delivering the energy pulse, the method comprises heating the workpiece to an intermediate temperature, wherein the intermediate temperature is in the range of about 20° C. to about 800° C.

5. The method of claim 4, wherein heating the workpiece to the intermediate temperature comprises heating the device side surface of the workpiece.

6. The method of claim 1, wherein the at least one heat source comprises an arc lamp.

7. The method of claim 1, wherein the at least one heat source comprises a laser.

8. The method of claim 1, wherein the energy pulse causes the device side surface to have a peak temperature in the range of about 40% to about 80% of a peak temperature of the non-device side temperature.

9. The method of claim 1, wherein the energy pulse causes the non-device side surface to have a peak temperature of about 1200° C. and the device side surface to have a peak temperature of about 850° C.

10. The method of claim 1, wherein the pulse duration is such that a 50° temperature peak width of a temperature of the device side surface is about 1.3 seconds or less.

11. The method of claim 1, wherein the non-device side surface of the workpiece comprises a compensating film, wherein one or more compensating properties of the compensating film correspond to non-uniform characteristics of one or more device structures on the device side surface.

12. The method of claim 1, wherein a mask structure is disposed between the at least one heat source and the non-device side surface.

13. The method of claim 1, wherein the device side surface is in thermal communication with a heat sink, wherein the heat sink comprises a hot plate in the thermal processing chamber.

14. The method of claim 13, wherein the method comprises supporting the workpiece on a gas cushion disposed between the hot plate and the workpiece, wherein the gas cushion has a thickness of about 0.02 mm to about 2 mm.

15. A method for processing a workpiece in a thermal processing system, the workpiece comprising a device side surface and a non-device side surface separated by a thickness, the method comprising:
   placing a workpiece on a workpiece support in a processing chamber of the thermal processing system such that the non-device side surface faces one or more arc lamps;
   heating the workpiece to an intermediate temperature using one or more heat sources;
   providing an irradiance flash to the non-device side surface of the workpiece using the one or more arc lamps, the irradiance flash having a duration of less than about 100 ms such that a rate of heating the device side surface is greater than 1000 K/s and a rate of cooling the device side surface is less than about 1000 K/s.

16. The method of claim 15, wherein the irradiance flash creates a temperature gradient between the device side surface of the workpiece and the non-device side surface of the workpiece.

17. The method of claim 15, wherein the irradiance flash causes the non-device side surface to achieve a peak temperature of about 1200° C.

18. The method of claim 17, wherein the irradiance flash causes the device side surface to have a 50° temperature peak width of about 1.3 seconds or less.

19. A method for processing a semiconductor workpiece, the method comprising:
- depositing a layer of semiconductor material onto the semiconductor workpiece at the device side of the semiconductor workpiece, the layer having an amorphous structure;
- doping the layer of semiconductor material with a dopant species;
- annealing the layer for crystallization using solid phase epitaxy;
- wherein during crystallization, the dopant species becomes incorporated into crystalline material
- wherein annealing the layer for crystallization comprises:
  - placing a workpiece on a workpiece support in a processing chamber of the thermal processing system such that the non-device side surface faces one or more arc lamps;
  - heating the workpiece to an intermediate temperature using one or more heat sources;
  - providing an irradiance flash to the non-device side surface of the workpiece using the one or more arc lamps, the irradiance flash having a duration of less than about 100 ms such that a rate of heating the device side surface is greater than 1000 K/s and a rate of cooling the device side surface is less than about 1000 K/s.

20. The method of claim 19, wherein the irradiance flash causes the non-device side surface to achieve a peak temperature of about 1200° C.

* * * * *